(12) United States Patent
Lin

(10) Patent No.: US 11,146,256 B2
(45) Date of Patent: Oct. 12, 2021

(54) ALTERNATING CURRENT SOLID-STATE RELAY

(71) Applicant: Xiamen Kudom Electronics Technology Co., Ltd, Xiamen (CN)

(72) Inventor: Yuchao Lin, Xiamen (CN)

(73) Assignee: XIAMEN KUDOM ELECTRONICS TECHNOLOGY CO., LTD, Xiamen (CN)

( * ) Notice: Subject to any disclaimer, the term of this patent is extended or adjusted under 35 U.S.C. 154(b) by 180 days.

(21) Appl. No.: 16/503,931

(22) Filed: Jul. 5, 2019

(65) Prior Publication Data

US 2020/0076417 A1 Mar. 5, 2020

(30) Foreign Application Priority Data

Sep. 4, 2018 (CN) .......................... 201811026023.4

(51) Int. Cl.
*H02M 1/08* (2006.01)
*H02M 3/24* (2006.01)
*H03K 17/0812* (2006.01)

(52) U.S. Cl.
CPC ........ *H03K 17/08128* (2013.01); *H02M 1/08* (2013.01); *H02M 3/24* (2013.01); *H03K 17/08122* (2013.01)

(58) Field of Classification Search
CPC ...... H03K 17/08128; H03K 17/08122; H02M 1/08; H02M 3/24; H02H 3/08; H02H 3/093
See application file for complete search history.

(56) References Cited

U.S. PATENT DOCUMENTS 4,429,339 A * 1/1984 Jaeschke ............ H03K 17/0822
330/207 P
4,975,683 A * 12/1990 Parsons .................. G08B 17/12
340/578

(Continued)

FOREIGN PATENT DOCUMENTS

CN 205986812 U 2/2017

OTHER PUBLICATIONS

IXYS Integrated Circuits Division, "IX2127 High-Voltage Power MOSFET and IGBT Driver," DS-IX2127-R03, Dec. 19, 2012 (Year: 2012).*

*Primary Examiner* — Scott Bauer
(74) *Attorney, Agent, or Firm* — Muncy, Geissler, Olds & Lowe, P.C.

(57) ABSTRACT

An alternating current solid-state relay having a short-circuit protection function, comprises an output switch circuit, which is connected to a load loop in series and comprises two power switch transistors, a driver circuit having a short-circuit protection function, and a short-circuit detection circuit, wherein the two power switch transistors are IGBTs or MOS transistors and are in opposing series, and two terminals formed after series connection of the two power switch transistors serve as two output terminals of the alternating current solid-state relay; a power circuit supplies power to the driver circuit, and the driver circuit correspondingly controls on-off of the two power switch transistors according to a control signal accessed to an input terminal of the driver circuit, and detects through the short-circuit detection circuit whether or not a short circuit happens to a load; and if yes, the two power switch transistors are controlled to be turned off.

12 Claims, 4 Drawing Sheets

(56) References Cited

U.S. PATENT DOCUMENTS

| | | | |
|---|---|---|---|
| 9,230,957 B2* | 1/2016 | Lui | H01L 29/66181 |
| 2009/0103223 A1* | 4/2009 | Prussmeier | H03K 17/0822 |
| | | | 361/93.9 |
| 2010/0091523 A1* | 4/2010 | Uno | H02M 1/4225 |
| | | | 363/20 |
| 2013/0128395 A1* | 5/2013 | Tsai | H02H 3/24 |
| | | | 361/42 |

* cited by examiner

ALTERNATING CURRENT SOLID-STATE RELAY

BACKGROUND OF THE INVENTION

1. Technical Field

The invention belongs to the technical field of solid-state relays, in particular to an alternating current solid-state relay having a short-circuit protection function.

2. Description of Related Art

Alternating current solid-state relays generally consist of a photocoupler, a thyristor, and other electronic components. For instance, Chinese Utility Model Patent Publication No. CN205986812U discloses a solid-state relay, which has a circuit easy to implement, is low in cost and can be widely used for motor control, heating control, and other occasions. However, in actual application, short circuits of the load frequently happen particularly on the occasion of heating control. Once a short circuit happens to the load, an extremely large short-circuit current will be generated in the whole loop, and if the solid-state relay fails to be automatically turned off for protection in this case, the solid-state relay may be damaged due to overcurrent and has to be stopped to be maintained, and the usage cost is high. The thyristor can be passively turned off only if the loop current is zero after the thyristor is triggered by the photocoupler to be turned on. When a short circuit happens to the load, the solid-state relay cannot be turned off timely even if the system cuts off the control signal to the solid-state relay in time after detecting the short circuit. Before the thyristor is turned off (the current reaches the zero crossing point), the short-circuit current has become large enough to burn out the thyristor or other devices. Therefore, the solid-state relay adopting the thyristor cannot reliably protect the load against short circuits.

BRIEF SUMMARY OF THE INVENTION

The objective of the invention is to solve the above-mentioned problems by providing an alternating current solid-state relay having a short-circuit protection function.

The technical solution adopted by the invention to fulfill the above objective is as follows: an alternating current solid-state relay comprises an output switch circuit connected to a load loop in series, wherein the output switch circuit comprises two power switch transistors, a driver circuit having a short-circuit protection function, and a short-circuit detection circuit; the two power switch transistors are IGBTs or MOS transistors and are in opposing series, and two terminals formed after series connection of the two power switch transistors serve as two output terminals of the alternating current solid-state relay; a power circuit supplies power to the driver circuit, and the driver circuit correspondingly controls on-off of the two power switch transistors according to a control signal accessed to an input terminal of the driver circuit, and detects through the short-circuit detection circuit whether or not a short circuit happens to a load; and if yes, the two power switch transistors are controlled to be turned off.

Furthermore, the two power switch transistors are IGBTs T1 and T2, the driver circuit consists of two IGBT driver chips IC1 and IC2 having a short-circuit protection function, and the IGBT driver chips IC1 and IC2 respectively drive the IGBTs T1 and T2.

Furthermore, the IGBT driver chips IC1 and IC2 are both IX2127 IGBT driver chips, an HO pin of the IGBT driver chip IC1 is in series with a resistor to be connected to a gate of the IGBT T1, and an HO pin of the IGBT driver chip IC2 is in series with a resistor to be connected to a gate of the IGBT T2; emitters of the IGBTs T1 and T2 are connected, and collectors of the IGBTs T1 and T2 respectively serve as the two output terminals of the alternating current solid-state relay and are connected to the load loop in series.

Furthermore, the short-circuit detection circuit is realized by a voltage division circuit which is used for detecting voltages at the two output terminals of the alternating current solid-state relay, output terminals of the voltage division circuit are respectively connected to CS pins of the IGBT driver chips IC1 and IC2, and the IGBT driver chips IC1 and IC2 determine whether or not a short circuit happens to the load according to voltages input to the CS pins.

Furthermore, the voltage division circuit comprises a diode D3, a diode D5, a resistor R1, a resistor R4, a resistor R6, a resistor R8, a resistor R2 and a resistor R9, wherein a first terminal of the resistor R1 is in forward series with the diode D3 to be connected to the collector of the IGBT T1, a second terminal of the resistor R1 is sequentially in series with the resistor R4 and the resistor R5 to be connected to a signal ground, and a node between the resistor R1 and the resistor R4 is connected to the CS pin of the IGBT driver chip IC1; a first terminal of the resistor R8 is in forward series with the diode D5 to be connected to the collector of the IGBT T2, a second terminal of the resistor R8 is sequentially in series with the resistor R6 and the resistor R5 to be connected to the signal ground, and a node between the resistor R8 and the resistor R6 is connected to the CS pin of the IGBT driver chip IC2; a first terminal of the resistor R2 is connected to an anode of the second diode D3, and a second terminal of the resistor R2 is connected to the HO pin of the IGBT driver chip IC1; and a first terminal of the resistor R9 is connected to an anode of the diode D5, and a second terminal of the resistor R9 is connected to the HO pin of the IGBT driver chip IC2.

Furthermore, the alternating current solid-state relay further comprises a timing circuit, wherein the timing circuit starts to perform timing when the driver circuit detects that a short circuit happens to the load, and outputs an enable signal to the driver circuit at the end of a preset timing cycle so as to drive the two power switch transistors to be turned on.

Furthermore, the timing circuit is realized by an MC14541B timer IC3.

Furthermore, the alternating current solid-state relay further comprises a photocoupler isolation circuit, wherein the control signal is accessed to an input terminal of the photocoupler isolation circuit, a first output terminal of the photocoupler isolation circuit is connected to an enable signal output terminal of the timing circuit, and a second output terminal of the photocoupler isolation circuit is connected to the input terminal of the driver circuit.

Furthermore, the photocoupler isolation circuit comprises a photocoupler P1, wherein the photocoupler P1 consists of a light-emitting diode and a phototriode.

Furthermore, the power circuit is an isolated DC/DC power circuit.

Furthermore, the power circuit comprises an isolated DC/DC converter S1 and a diode D1, wherein a positive input terminal of the isolated DC/DC converter S1 is in inverse series with the diode D1 to be connected to an input power, and a negative input terminal of the isolated DC/DC converter S1 is grounded; and a positive output terminal of the isolated DC/DC converter S1 is connected to a power terminal of the driver circuit, and a negative output terminal of the isolated DC/DC converter S1 is connected to the signal ground.

Furthermore, the power circuit further comprises capacitors C1 and C2, wherein the capacitor C1 is connected between the positive input terminal and the negative input terminal of the isolated DC/DC converter S1, and the capacitor C2 is connected between the positive output terminal and the negative output terminal of the isolated DC/DC converter S1.

Furthermore, the alternating current solid-state relay further comprises a resistor R15 and a capacitor C8, wherein the resistor R15 and the capacitor C8 are connected in series and are then connected between the two output terminals of the alternating current solid-state relay.

The invention has the following beneficial effects:

In the invention, two IGBTs or MOS transistors in opposing series are adopted to replace a common thyristor, two driver chips having a short-circuit protection function are adopted to respectively drive the two IGBTs or MOS transistors, and a load can be protected against short circuits by means of the active turn-off characteristic of the IGBTs or MOS transistors, so that the alternating current solid-state relay is high in reliability and long in service life. In addition, the timing circuit is used to regularly detect whether or not the short-circuit fault of the load is removed, and the alternating current solid-state relay automatically returns to the normal working state after the short-circuit fault of the load is removed, so that using is convenient, and the user experience is improved.

The alternating current solid-state relay of the invention has a simple circuit structure and is easy to implement and low in cost.

DETAILED DESCRIPTION OF THE INVENTION

The invention is further explained below with reference to the accompanying drawings and specific implementations.

An alternating current solid-state relay comprises an output switch circuit, a photocoupler isolation circuit, a power circuit, and a timing circuit, wherein the output switch circuit, the photocoupler isolation circuit, the power circuit, and the timing circuit are connected to a load loop in series. The output switch circuit comprises two power switch transistors, a driver circuit having a short-circuit protection function, and a short-circuit detection circuit, wherein the power switch transistors are IGBTs or MOS transistors and are provided with diodes, the two power switch transistors are in opposing series, and two terminals formed after series connection of the two power switch transistors serve as two output terminals of the alternating current solid-state relay and are connected to the load loop in series; the power circuit supplies power to the driver circuit, a control signal is isolated by the photocoupler isolation circuit to be transmitted to the driver circuit, the driver circuit correspondingly controls on-off of the two power switch transistors according to the control signal and synchronously detects through the short-circuit detection circuit whether or not a short circuit happens to the load; and if yes, the two power switch transistors are controlled to be turned off.

The timing circuit starts to perform timing when the driver circuit detects a short circuit of the load, and outputs an enable signal to the driver circuit at the end of a preset timing cycle to drive the two power switch transistors to be turned on. If the short-circuit fault of the load is removed at this moment, the alternating current solid-state relay starts to operate normally; otherwise, if the short-circuit fault of the load still exists, the driver circuit detects the short circuit of the load again through the short-circuit detection circuit and controls the two power switch transistors to be turned off again, and the timing circuit starts to perform timing again and outputs an enable signal to the driver circuit at the end of another timing cycle to drive the two power switch transistors to be turned on; and this process is repeated.

Figure 2:
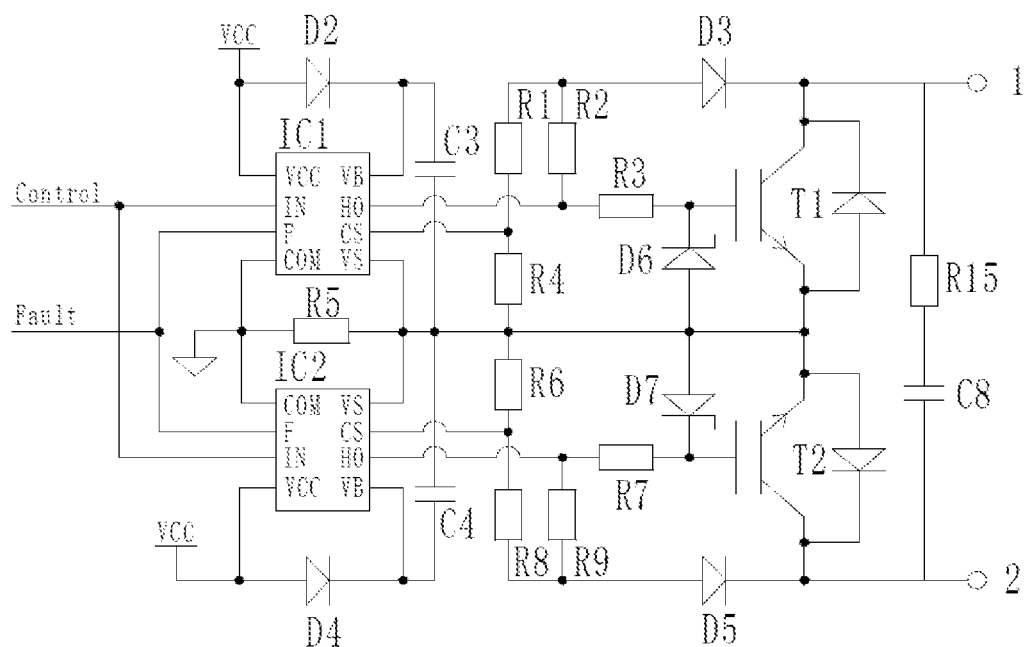
FIG. 2 is a schematic circuit diagram of a driver circuit and a short-circuit detection circuit in the embodiment of the invention.

As shown in FIG. 2, in this embodiment, the power switch transistors are preferably IGBTs T1 and T2 which are provided with diodes. Emitters of the IGBTs T1 and T2 are connected, and a node between the emitters of the IGBTs T1 and T2 is in series with a resistor R5 to be connected to a signal ground. Collectors of the IGBTs T1 and T2 serve as two output terminals 1 and 2 of the alternating current solid-state relay and are connected to the load loop in series. Clearly, in other embodiments, the power switch transistors can also be MOS transistors, and this is easily achievable for those skilled in the art and will not be detailed anymore.

As shown in FIG. 2, in this embodiment, the driver circuit consists of two IGBT driver chips IC1 and IC2 having a short-circuit protection function, wherein the IGBT driver chips IC1 and IC2 are both IX2127 IGBT driver chips; an HO pin of the IGBT driver chip IC1 is in series with a resistor R3 to be connected to a gate of the IGBT T1, and an HO pin of the IGBT driver chip IC2 is in series with a resistor R7 to be connected to a gate of the IGBT T2; and a zener diode D6 is connected between the gate and the emitter of the IGBT T1 and is used for protecting the IGBT T1, and a zener diode D7 is connected between the gate and the emitter of the IGBT T2 and is used for protecting the IGBT T2. Clearly, in other embodiments, the IGBT driver chips IC1 and IC2 can also be other IGBT driver chips having a short-circuit protection function, and this is easily achievable for those skilled in the art and will not be detailed anymore.

In this embodiment, the short-circuit detection circuit is implemented by a voltage division circuit which is used for detecting voltages at the two output terminals 1 and 2 of the alternating current solid-state relay, wherein two output terminals of the voltage division circuit are respectively connected to CS pins of the IGBT driver chips IC1 and IC2, and the IGBT driver chips IC1 and IC2 determine whether or not a short circuit happens to the load according to voltages input to the CS pins due to the fact that when the alternating current solid-state relay is in an on state, the current of an output loop will sharply increase if a short circuit happens to the load, which in turn causes increase of the voltages at the two output terminals 1 and 2 of the alternating current solid-state relay.

Particularly, as shown in FIG. 2, the voltage division circuit comprises a diode D3, a diode D5, a resistor R1, a resistor R4, a resistor R6, a resistor R8, a resistor R2 and a resistor R9, wherein a first terminal of the resistor R1 is in forward series with the diode D3 to be connected to the collector of the IGBT T1 (the output terminal 1 of the alternating current solid-state relay), a second terminal of the resistor R1 is sequentially in series with the resistor R4 and the resistor R5 to be connected to the signal ground, and a node between the resistor R1 and the resistor R4 is connected to the CS pin of the IGBT driver chip IC1; a first terminal of the resistor R8 is in forward series with the diode D5 to be connected to the collector of the IGBT T2 (the output terminal 2 of the alternating current solid-state relay), a second terminal of the resistor R8 is sequentially in series with the resistor R6 and the resistor R5 to be connected to the signal ground, and a node between the resistor R8 and the resistor R6 is connected to the CS pin of the IGBT driver chip IC2; a first terminal of the resistor R2 is connected to an anode of the diode D3, and a second terminal of the resistor R2 is connected to the HO pin of the IGBT driver chip IC1; a first terminal of the resistor R9 is connected to an anode of the diode D5, and a second terminal of the resistor R9 is connected to the HO pin of the IGBT driver chip IC2; and the emitters of the IGBTs T1 and T2 are connected to the signal ground via the resistor R5.

Figure 1:
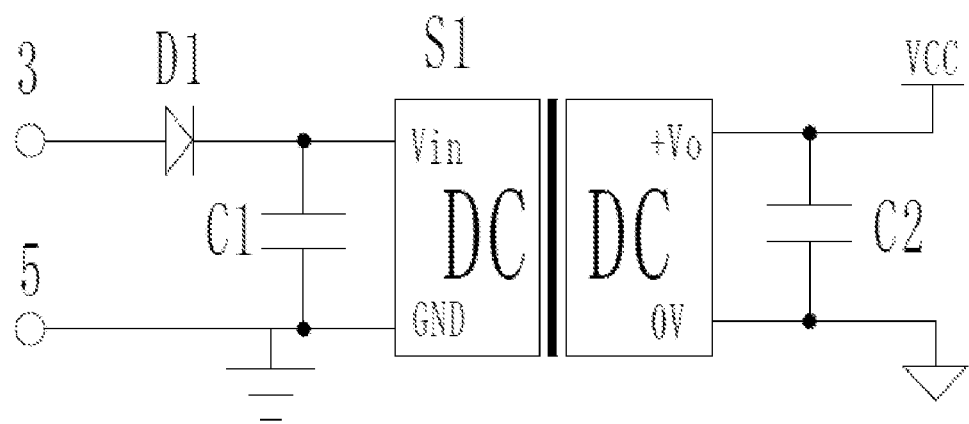
FIG. 1 is a schematic circuit diagram of a power circuit in one embodiment of the invention.

As shown in FIG. 1, in this embodiment, the power circuit is an isolated DC/DC power circuit high in safety, and particularly comprises an isolated DC/DC converter S1 and a diode D1, wherein a positive input terminal Vin of the isolated DC/DC converter S1 is in reverse series with the diode D1 to be connected to an input power, and a negative input terminal GND of the isolated DC/DC converter S1 is grounded; a positive output terminal +Vo of the isolated DC/DC converter S1 is connected to VCC pins of the IGBT driver chips IC1 and IC2, and a negative output terminal 0V of the isolated DC/DC converter S1 is connected to the signal ground.

The power circuit further comprises a capacitor C1 and a capacitor C2, wherein the capacitor C1 is connected between the positive input terminal Vin and the negative input terminal GND of the isolated DC/DC converter S1 and is used for filtering the input power so as to improve the stability of input power, and the capacitor C2 is connected between the positive output terminal +Vo and the negative output terminal 0V of the isolated DC/DC converter S1 and is used for filtering an output power of the power circuit so as to improve the stability of the output power.

Clearly, in other embodiments, the power circuit can be other power circuits in the prior art, and this is easily achievable for those skilled in the art and will not be detailed anymore.

Figure 4:
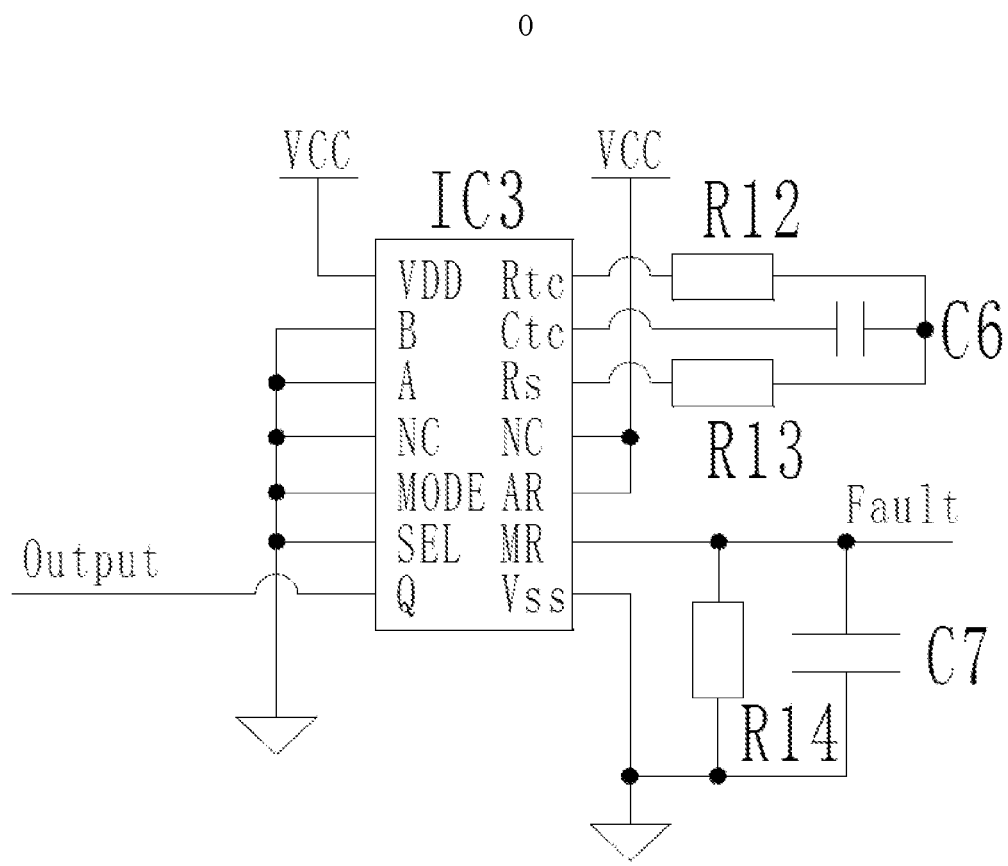
FIG. 4 is a schematic circuit diagram of a timing circuit in the embodiment of the invention.

As shown in FIG. 4, in this embodiment, the timing circuit is realized by an MC14541B programmable timer IC3, wherein a VDD pin of the timer IC3 is connected to the positive output terminal +Vo of the isolated DC/DC converter S1, an MR pin of the timer IC3 is synchronously connected to F pins of the IGBT driver chips IC1 and IC2, a Q pin of the timer IC3 serves as an enable signal output pin, and circuit connection of other pins of the timer IC3 is shown in FIG. 4 and will not be detailed anymore. When the timer IC3 starts to perform timing, the Q pin of the timer IC3 outputs a low level; and at the end of the timing of the timer IC3, the Q pin of the timer IC3 outputs a high level (enable signal). Clearly, in other embodiments, when the timer IC3 starts to perform timing, the Q pin of the timer IC3 outputs a high level; and at the end of the timing of the timer IC3, the Q pin of the timer IC3 outputs a low level, and this is easily achievable for those skilled in the art and will not be detailed anymore.

Clearly, in other embodiments, the timing circuit can also be other timing circuits in the prior art, and this is easily achievable for those skilled in the art and will not be detailed anymore.

Figure 3:
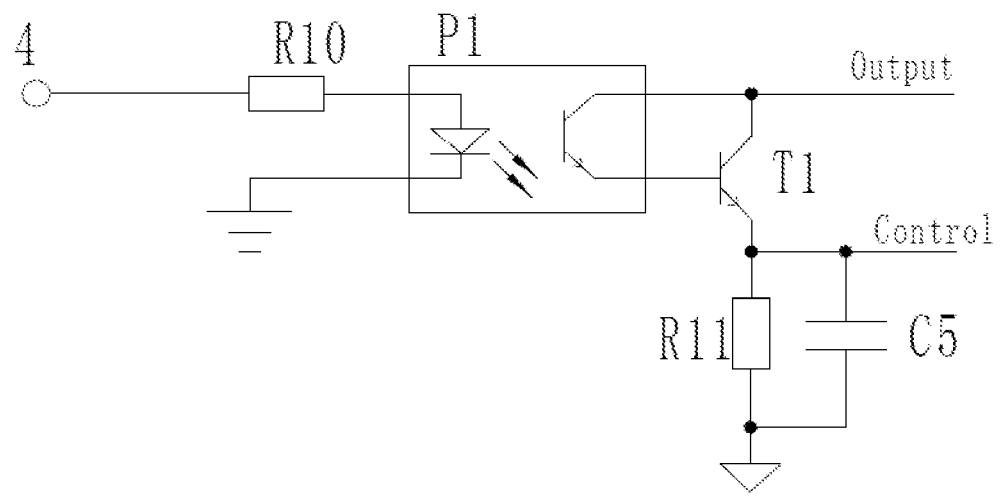
FIG. 3 is a schematic circuit diagram of a photocoupler isolation circuit in the embodiment of the invention.

As shown in FIG. 3, in this embodiment, the photocoupler isolation circuit comprises a photocoupler P1 and a NPN triode T1. The photocoupler P1 consists of a light-emitting diode and a phototriode, wherein a positive terminal of the light-emitting diode of the photocoupler P1 is in series with a resistor R10 to be connected to the control signal, and a negative terminal of the light-emitting diode of the photocoupler P1 is grounded; a collector of the phototriode of the photocoupler P1 is connected to the Q pin of the timer IC3 and a collector of the NPN triode T1, an emitter of the phototriode of the photocoupler P1 is connected to a base of the NPN triode T1, and an emitter of the NPN triode T1 is connected to IN pins of the IGBT driver chips IC1 and IC2 and is in series with a resistor R11 and a capacitor C5 to be connected to the signal ground. Clearly, in other embodiments, the photocoupler isolation circuit can also be other photocoupler isolation circuits in the prior art, and this is easily achievable for those skilled in the art and will not be detailed anymore.

In this embodiment, the alternating current solid-state relay further comprises a resistor R15 and a capacitor C8, wherein the resistor R15 and the capacitor C8 are connected in series and are then connected between the two output terminals 1 and 2 of the alternating current solid-state relay, and a resistance-capacitance snubber circuit is formed by the resistor R15 and the capacitor C8, so that the viability of the IGBTs T1 and T2 under electric shocks is improved.

Operating Process:

During normal operation: when a control signal is sent to the front end of the resistor R10, the photocoupler P1 is turned on, at this moment, the Q pin of the timing circuit outputs a high level, the IN pins of the IGBT driver chips IC1 and IC2 are at a high level, and the HO pins of the IGBT driver chips IC1 and IC2 output a high level to drive the IGBTs T1 and T2 to be turned on, then the output loop is turned on, and the alternating current solid-state relay is in an on state. When the control signal sent to the input terminal is cut off, the photocoupler P1 is cut off, the IN pins of the IGBT driver chips IC1 and IC2 are at a low level, the HO pins of the IGBT driver chips IC1 and IC2 output a low level, the IGBTs T1 and T2 are turned off, and the alternating current solid-state relay are in an off state.

Short-circuit protection principle: when the alternating current solid-state relay is in an on state, the current of the output loop increases sharply if a short circuit happens to the load, the voltages at the two output terminals 1 and 2 of the alternating current solid-state relay increase accordingly, in this case, the voltages of the CS pins of the IGBT driver chips IC1 and IC2 also increase, and the IGBT driver chips IC1 and IC2 determine that a short circuit happens to the load once the voltages of the CS pins increase to a certain value; the output of the HO pins of the IGBT driver chips IC1 and IC2 rapidly decrease to zero from a normal high level, so that the IGBTs T1 and T2 are switched to an off state from an on state to enter into a short-circuit protection mode, so that the IGBTs T1 and T2 are protected against damage caused by excessive short-circuit currents. Meanwhile, F pins of the IGBT driver chips IC1 and IC2 output a signal to the MR pin of the timer IC3, then the timing circuit start to work, the Q pin of the timer IC3 decreases to a low level from a high level, and the IN pins of the IGBT driver chips IC1 and IC2 are at a low level to drive the IGBTs T1 and T2 to be turned off. At the end of timing, the Q pin of the timer IC3 is switched to a high level from a low level, and the IN pins of the IGBT driver chips IC1 and IC2 are at a high level to drive the IGBTs T1 and T2 to be turned on; and if the short-circuit fault of the load is removed, the alternating current solid-state relay start to work normally; or, if the load still has the short-circuit fault, the alternating current solid-state relay enters into the short-circuit protection mode again and whether or not the load is still in the short-circuit state is determined again at the end of the next timing cycle; this process is repeated.

In the invention, the two IGBTs T1 and T2 in opposing series are adopted to replace the common thyristor, the two IGBT driver chips IC1 and IC2 having the short-circuit protection function are adopted to respectively drive the IGBTs T1 and T2, and the load can be protected against short circuits by means of the active turn-off characteristic of the IGBTs T1 and T2, so that the alternating current solid-state relay is high in reliability and long in service life; the timing circuit is adopted to regularly detect whether or not the short-circuit fault of the load is removed, and the alternating current solid-state relay automatically returns to the normal working state if the shirt-circuit fault is removed, so that using is convenient, and the user experience is improved; and the alternating current solid-state relay has a simple circuit structure and is easy to implement and low in cost.

Clearly, in other embodiments, the timing circuit can be omitted to reduce the cost. However, if the timing circuit is omitted, whether or not the short-circuit fault of the load is removed cannot be regularly detected anymore, and the alternating current solid-state relay cannot automatically return to the normal working state either after the short-circuit fault of the load is removed.

The invention is specifically illustrated and explained with reference to the preferred embodiments. Those skilled in the art should understand that various variations of the invention can be made in forms and in details without deviating from the spirit and scope defined by the claims, and all these variations should also fall within the protection scope of the invention.

What is claimed is:

1. An alternating current solid-state relay, comprising an output switch circuit connected to a load loop in series, wherein the output switch circuit comprises two power switch transistors, a driver circuit having a short-circuit protection function, and a short-circuit detection circuit; the two power switch transistors are IGBTs or MOS transistors and are in opposing series, and two terminals formed after series connection of the two power switch transistors serve as two output terminals of the alternating current solid-state relay; a power circuit supplies power to the driver circuit, and the driver circuit correspondingly controls on-off of the two power switch transistors according to a control signal accessed to an input terminal of the driver circuit, and detects through the short-circuit detection circuit whether or not a short circuit happens to a load; and if yes, the two power switch transistors are controlled to be turned off;

wherein the alternating current solid-state relay further comprises a photocoupler isolation circuit, the control signal is accessed to an input terminal of the photocoupler isolation circuit, a first output terminal of the photocoupler isolation circuit is connected to an enable signal output terminal of the timing circuit, and a second output terminal of the photocoupler isolation circuit is connected to the input terminal of the driver circuit.

2. The alternating current solid-state relay according to claim 1, wherein the two power switch transistors are IGBTs T1 and T2, the driver circuit consists of two IGBT driver chips IC1 and IC2 having a short-circuit protection function, and the IGBT driver chips IC1 and IC2 respectively drive the IGBTs T1 and T2.

3. The alternating current solid-state relay according to claim 2, wherein the IGBT driver chips IC1 and IC2 are both IX2127 IGBT driver chips, an HO pin of the IGBT driver chip IC1 is in series with a resistor to be connected to a gate of the IGBT T1, and an HO pin of the IGBT driver chip IC2 is in series with a resistor to be connected to a gate of the IGBT T2; emitters of the IGBTs T1 and T2 are connected, and collectors of the IGBTs T1 and T2 respectively serve as the two output terminals of the alternating current solid-state relay and are connected to the load loop in series.

4. The alternating current solid-state relay according to claim 3, wherein the short-circuit detection circuit is realized by a voltage division circuit which is used for detecting voltages at the two output terminals of the alternating current solid-state relay, output terminals of the voltage division circuit are respectively connected to CS pins of the IGBT driver chips IC1 and IC2, and the IGBT driver chips IC1 and IC2 determine whether or not a short circuit happens to the load according to voltages input to the CS pins.

5. The alternating current solid-state relay according to claim 4, wherein the voltage division circuit comprises a diode D3, a diode D5, a resistor R1, a resistor R4, a resistor R6, a resistor R8, a resistor R2 and a resistor R9, wherein a first terminal of the resistor R1 is in forward series with the diode D3 to be connected to the collector of the IGBT T1, a second terminal of the resistor R1 is sequentially in series with the resistor R4 and the resistor R5 to be connected to a signal ground, and a node between the resistor R1 and the resistor R4 is connected to the CS pin of the IGBT driver chip IC1; a first terminal of the resistor R8 is in forward series with the diode D5 to be connected to the collector of the IGBT T2, a second terminal of the resistor R8 is sequentially in series with the resistor R6 and the resistor R5 to be connected to the signal ground, and a node between the resistor R8 and the resistor R6 is connected to the CS pin of the IGBT driver chip IC2; a first terminal of the resistor R2 is connected to an anode of the second diode D3, and a second terminal of the resistor R2 is connected to the HO pin of the IGBT driver chip IC1; and a first terminal of the resistor R9 is connected to an anode of the diode D5, and a second terminal of the resistor R9 is connected to the HO pin of the IGBT driver chip IC2.

6. The alternating current solid-state relay according to claim 1, wherein the alternating current solid-state relay further comprises a timing circuit, and the timing circuit starts to perform timing when the driver circuit detects that a short circuit happens to the load, and outputs an enable signal to the driver circuit at the end of a preset timing cycle so as to drive the two power switch transistors to be turned on.

7. The alternating current solid-state relay according to claim 6, wherein the timing circuit is realized by an MC14541B timer IC3.

8. The alternating current solid-state relay according to claim 1, wherein the photocoupler isolation circuit comprises a photocoupler P1 which consists of a light-emitting diode and a phototriode.

9. The alternating current solid-state relay according to claim 1, wherein the power circuit is an isolated DC/DC power circuit.

10. The alternating current solid-state relay according to claim 9, wherein the power circuit comprises an isolated DC/DC converter S1 and a diode D1; a positive input terminal of the isolated DC/DC converter S1 is in inverse series with the diode D1 to be connected to an input power, and a negative input terminal of the isolated DC/DC converter S1 is grounded; and a positive output terminal of the isolated DC/DC converter S1 is connected to a power terminal of the driver circuit, and a negative output terminal of the isolated DC/DC converter S1 is connected to a signal ground.

11. The alternating current solid-state relay according to claim 10, wherein the power circuit further comprises capacitors C1 and C2, the capacitor C1 is connected between the positive input terminal and the negative input terminal of the isolated DC/DC converter S1, and the capacitor C2 is connected between the positive output terminal and the negative output terminal of the isolated DC/DC converter S1.

12. The alternating current solid-state relay according to claim 1, wherein the alternating current solid-state relay further comprises a resistor R15 and a capacitor C8, and the resistor R15 and the capacitor C8 are connected in series and are then connected between the two output terminals of the alternating current solid-state relay.

* * * * *